United States Patent
Ishibashi

(10) Patent No.: US 8,267,042 B2
(45) Date of Patent: Sep. 18, 2012

(54) PLASMA PROCESSING APPARATUS AND PLASMA PROCESSING METHOD

(75) Inventor: Kiyotaka Ishibashi, Amagasaki (JP)

(73) Assignee: Tokyo Electron Limited (JP)

( * ) Notice: Subject to any disclaimer, the term of this patent is extended or adjusted under 35 U.S.C. 154(b) by 472 days.

(21) Appl. No.: 12/420,458

(22) Filed: Apr. 8, 2009

(65) Prior Publication Data

US 2009/0291563 A1      Nov. 26, 2009

(30) Foreign Application Priority Data

May 23, 2008   (JP) ................................. 2008-135553

(51) Int. Cl.
C23C 16/00       (2006.01)
C23F 1/00        (2006.01)
H01L 21/306      (2006.01)

(52) U.S. Cl. ........... 118/723 MW; 118/715; 118/723 R; 156/345.33; 156/345.34; 156/345.29; 156/345.41

(58) Field of Classification Search ............. 156/345.33, 156/345.34, 345.41, 345.48, 345.29; 118/715, 118/723 I, 723 MW, 723 R; 315/111.51

See application file for complete search history.

(56) References Cited

U.S. PATENT DOCUMENTS

| 5,346,555 | A  * | 9/1994 | Nunotani et al. | ............. | 118/724 |
| 7,374,620 | B2 * | 5/2008 | Ohmi et al. | ................... | 118/715 |
| 2003/0148623 | A1 |  | 8/2003 | Ohmi et al. | |
| 2004/0134613 | A1 * | 7/2004 | Ohmi et al. | ............... | 156/345.41 |
| 2008/0149274 | A1 * | 6/2008 | Suzuki | ..................... | 156/345.41 |
| 2010/0326599 | A1 * | 12/2010 | Hwang et al. | ............ | 156/345.29 |

FOREIGN PATENT DOCUMENTS

| JP | 2000-012471 |   | 1/2000 |
| JP | 2002-299331 |   | 10/2002 |
| KR | 10-2007-0083333 |   | 8/2007 |
| KR | 809852 | * | 3/2008 |
| WO | WO 2004/100248 | * | 11/2004 |

OTHER PUBLICATIONS

Notice of Preliminary Rejection issued by Korean Intellectual Property Office on Jan. 10, 2011, citing KR10-2007-0083333 and JP2000-012471.

* cited by examiner

*Primary Examiner* — Rakesh Dhingra
(74) *Attorney, Agent, or Firm* — Cantor Colburn LLP

(57) ABSTRACT

The shower plate is arranged to seal an upper opening of a process container that is configured by a chamber, a spacer, and an upper plate. A plasma excitation gas is spurted into the chamber through the opening portions of the shower plate. Microwaves are supplied to a slot antenna arranged outside the shower plate, thereby generating plasma. Atmospheric air in a first gap between the inner wall of the spacer and the outer circumferential surface of the shower plate and a second gap between a radiation surface of the slot antenna and the dielectric cover plate is sucked by a gas suction unit through gas exhaust holes. The toxic gas is purified by a gas purification unit. Thus, the toxic gas is prevented from leaking out of the plasma processing apparatus even when the shower plate is broken.

10 Claims, 3 Drawing Sheets

PLASMA PROCESSING APPARATUS AND PLASMA PROCESSING METHOD

CROSS-REFERENCE TO RELATED PATENT APPLICATIONS

This application claims the benefit of Japanese Patent Application No. 2008-135553, filed on May 23, 2008, in the Japan Patent Office, the disclosure of which is incorporated herein in its entirety by reference.

BACKGROUND OF THE INVENTION

1. Field of the Invention

The present invention relates to an apparatus for plasma processing a semiconductor substrate by using microwaves.

2. Description of the Related Art

Japanese Laid-Open Patent Publication No. 2002-299331 discloses an apparatus for plasma processing a semiconductor substrate by using microwaves. The plasma processing apparatus includes a chamber, and a susceptor holding a substrate to be processed is provided in the chamber. A shower plate is arranged in the chamber at a position corresponding to the substrate placed on the susceptor. The shower plate includes a dielectric window main body formed of a low loss dielectric such as alumina and having a plate shape in which a plurality of opening portions for spurting plasma gas are formed, and a dielectric cover plate formed of the low loss dielectric and arranged above the dielectric window main body.

The shower plate spurts plasma excitation gas such as Ar or Kr that is externally supplied at a constant concentration into a space in the chamber from the opening portions. Additionally a radial line slot antenna is placed in the chamber above the dielectric cover plate. Microwaves from an external microwave source are radiated into the chamber through the radial line slot antenna to excite the plasma excitation gas spurted into the space of the chamber. A gap between the dielectric cover plate and a radiation surface of the radial line slot antenna is maintained at atmospheric pressure.

By using the radial line slot antenna, a uniform high density plasma is generated in a space directly under the dielectric window main body. The high density plasma generated in this manner has a low electron temperature so that damage to the substrate may be prevented. Also, metal contamination due to sputtering of an inner wall of the chamber may be prevented. Furthermore, since the generated plasma has high density, a substrate process such as film forming can be efficiently carried out at high speed.

With an increase in the size of the substrate, the size of the plasma process apparatus has increased too. Also, the size of the shower plate including the dielectric window main body and the dielectric cover plate has increased. The shower plate is formed of a dielectric such as $Al_2O_3$, AlN, or $SiO_2$. Since the inside of the plasma processing apparatus is maintained at a reduced pressure, a force in a downward direction perpendicular to the shower plate is generated and applied to the shower plate having a large area. In this state, when an external shock or thermal shock is applied to the shower plate, the shower plate may be easily broken.

When the shower plate is broken, although the dielectric window main body is covered with the dielectric cover plate, the plasma excitation gas in a process container and the process gas or film forming gas supplied to the inside of the chamber are leaked out through a gap between the dielectric cover plate and the radiation surface side of the radial line slot antenna, because there is the gap between the dielectric cover plate and the inner wall of the chamber. Since the gap between the dielectric cover plate and the radiation surface of the radial line slot antenna is in communication with air in the atmosphere, the gas in the process container may be leaked out of the plasma process container.

In particular, since the pressure of the plasma excitation gas supplied to the shower plate is several hundreds torrs high, the amount of the gas leaking when the shower plate is broken is very large. Also, since the film forming gas or cleaning gas is very toxic, it is very dangerous when the shower plate is broken and thus the toxic gas is leaked out of the apparatus.

SUMMARY OF THE INVENTION

To solve the above and/or other problems, the present invention provides a plasma processing apparatus which can prevent a toxic gas from leaking out of the apparatus even when a shower plate is broken, and a plasma processing method.

According to an aspect of the present invention, a plasma processing apparatus may include a process container having an upper opening, a top plate having an outer circumferential surface arranged to form a first gap with an inner wall of the process container, for sealing the upper opening of the process container, a cover member arranged to form a second gap with the top plate and covering the top plate, an electromagnetic energy supply unit arranged in the second gap between the top plate and the cover member and supplying electromagnetic energy to the top plate to generate plasma under the top plate, a gas distribution unit distributing gas under the top plate in the process container, and a gas flow generation unit provided at at least one of the first and second gaps and generating a gas flow moving out of the process container.

In the present invention, since a gas flow moving out of the process container is generated at at least one of the first gap between the inner wall of the process container and the outer circumferential surface of the top plate and the second gap between the top plate and the cover member, the leakage of gas out of the apparatus through the first or second gap due to the breakage of the top plate can be prevented.

The process container may comprise a first exhaust hole connected to the first gap, the cover member may comprise a second exhaust hole connected to the second gap, and the gas flow generation unit may comprise a flow rate adjustment unit that controls a gas flow moving toward the first exhaust hole and a gas flow moving toward the second exhaust hole to have the same flow rate.

Since the gas flow moving toward the first and the gas flow moving toward the second exhaust hole are adjusted to have the same flow rate, a difference in pressure between the first and second gaps is hardly generated.

The gas flow generation unit may include a suction unit sucking a gas flow including gas leaked to any one of the first and second gaps by making the first and second gaps under a weak negative pressure, and a gas purification unit purifying a toxic gas from the leaked gas.

Since the leaked toxic gas is purified, the surrounding environment is not contaminated.

The gas distribution unit may include a plurality of openings formed in the top plate and distributing gas to the process container, and a supply groove formed in the top plate and supplying the gas to the plurality of openings.

The gas can be distributed to the process container through the plurality of openings from the supply groove.

The top plate may include a dielectric window main body in which the supply groove and the plurality of openings are formed, and a dielectric cover member covering the dielectric window main body.

The top plate may have a gas distribution function.

The first exhaust hole may be connected to the first gap formed in a side wall of the process container.

Even when the gas is leaked through the first gap, the leaked gas can be exhausted from the first gap.

The electromagnetic energy supply unit may be arranged above the top plate, supply electromagnetic energy passing through the top plate to the process container, and include a flat antenna generating plasma under the top plate. The second exhaust hole may be connected to the second gap facing the flat antenna and the top plate and the gas in the second exhaust hole may be sucked by the suction unit.

Since the electromagnetic energy is supplied to the flat antenna, plasma can be generated under the top plate.

A plurality of slots may be formed in the flat antenna, and the apparatus may comprise a coaxial waveguide having an inner conductive body connected to the flat antenna and an outer conductive body in which an opening connected to the second exhaust hole is formed.

Plasma can be generated under the top plate by supplying microwaves to the flat antenna via the coaxial waveguide.

The electromagnetic energy supply unit may comprise a flat coil wound in a vortex shape arranged above the top plate and generating under the top plate high temperature plasma obtained by generating Joule's heat by an eddy current in the plasma, by a variable magnetic field generated by a high frequency signal. The second exhaust hole may be connected to the second gap formed between the top plate and the cover member and the gas in the second exhaust hole may be sucked by the suction unit.

In the present embodiment, an inductively coupled plasma (ICP) may be generated under the top plate.

The process container may include a first suction hole sucking the atmospheric air and connected to the first gap in which the electromagnetic energy supply unit and the top plate face each other.

The gas flow moving toward the first exhaust hole from the first suction hole through the first gap may be generated.

The cover member may include a second suction hole sucking the atmospheric air and connected to the second gap formed between the top plate and the cover member.

The gas flow moving toward the second exhaust hole from the second suction hole through the second gap may be generated.

According to another aspect of the present invention, a plasma processing method may include supplying electromagnetic energy to a process container in which a substrate to be processed is placed, processing the substrate to be processed using a gas supplied to the inside of the process container and excited by the electromagnetic energy, and generating a gas flow moving out of the process container, in a gap between the process container and the top plate facing the process container, at least during the processing of the substrate to be processed.

At least during the processing of the substrate to be processed, since the gas flow is generated between the process container and the top plate facing the process container, the gas is prevented from leaking out of the apparatus even when the top plate is broken.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
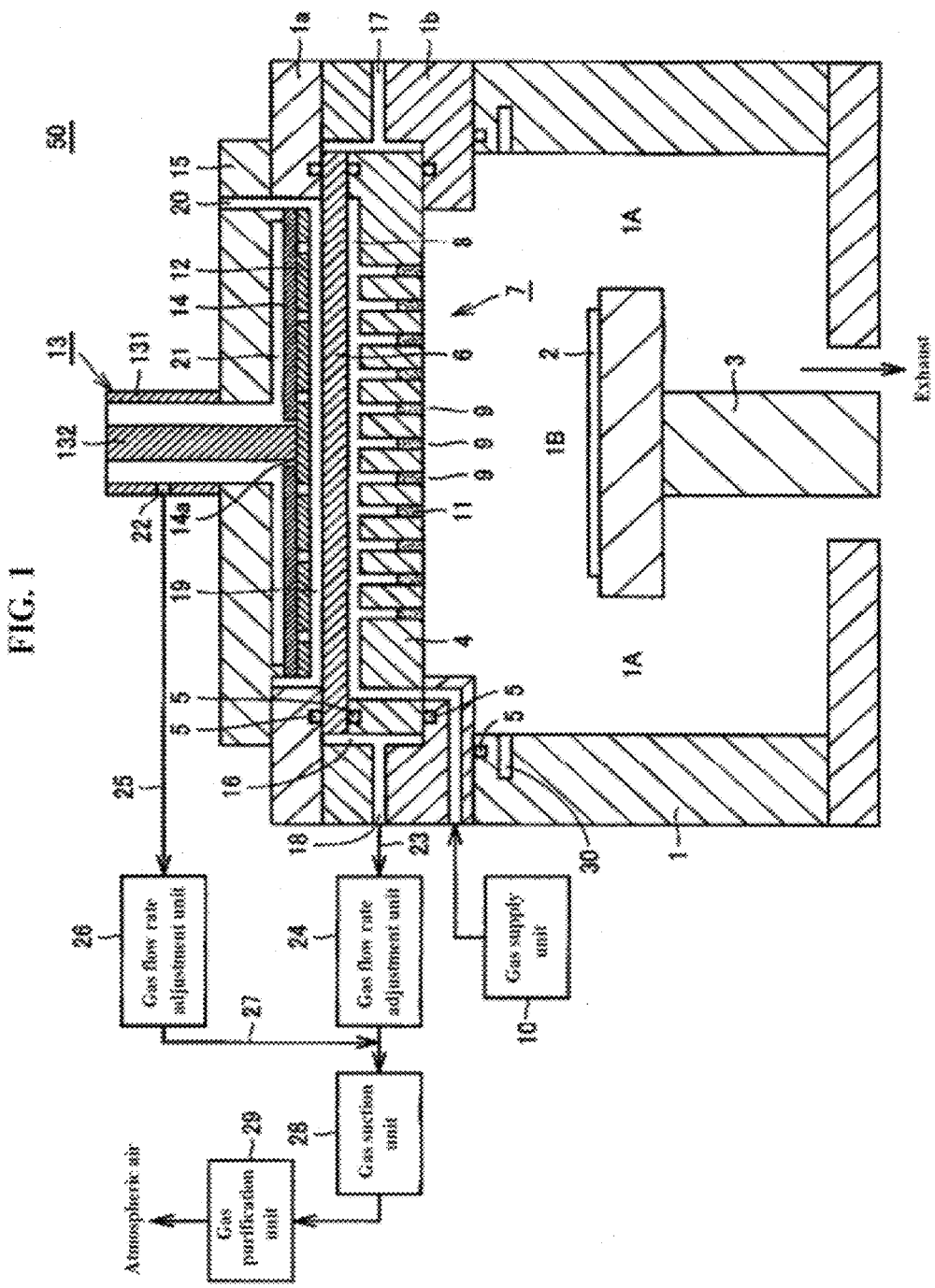
FIG. 1 is a cross-sectional view of a plasma processing apparatus according to an embodiment of the present invention.

The attached drawings for illustrating exemplary embodiments of the present invention are referred to in order to gain a sufficient understanding of the present invention, the merits thereof, and the objectives accomplished by the implementation of the present invention. Hereinafter, the present invention will be described in detail by explaining exemplary embodiments of the invention with reference to the attached drawings. Like reference numerals in the drawings denote like elements.

Figure 2:
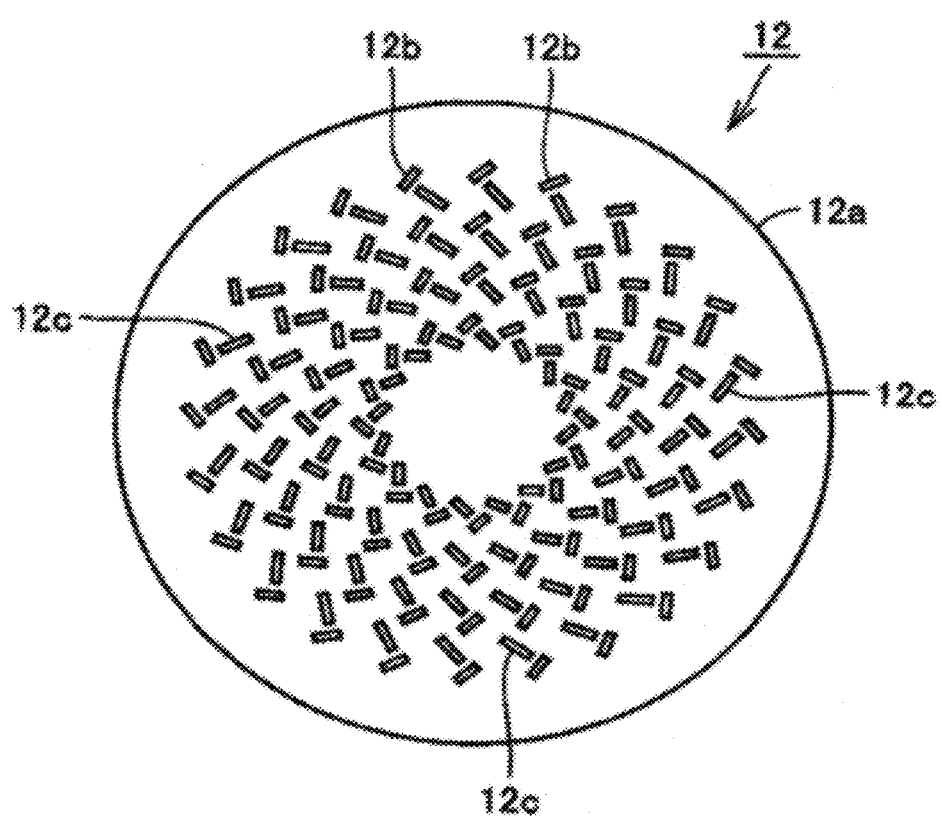
FIG. 2 is a plan view of a slot antenna of FIG. 1.

FIG. 1 is a cross-sectional view of a plasma processing apparatus 50 according to an embodiment of the present invention. FIG. 2 is a plan view of a slot antenna of FIG. 1.

Referring to FIG. 1, the plasma processing apparatus 50 includes a chamber 1 operating as a process container having an upper opening, a spacer 1b, and an upper plate 1a. A process gas supply hole 30 is formed in an inner wall of the chamber 1. The chamber 1 as a process container is formed of a metal, for example, an aluminum alloy, which does not allow microwaves as electromagnetic energy to leak therethrough.

A susceptor 3 holding a substrate 2 to be processed is arranged in the chamber 1. To uniformly exhaust the gas in the chamber 1, a space 1A having a ring shape is formed around the susceptor 3 and the gas is exhausted downwardly. A dielectric window main body 4 formed of a low loss dielectric is arranged, as a part of an outer wall of the chamber 1, in the chamber 1 at a position corresponding to the substrate 2 placed on the susceptor 3 in order to be processed and is supported by the spacer 1b via a seal ring 5.

A dielectric cover plate 6 formed of the low loss dielectric is arranged outside the dielectric window main body 4. A shower plate 7 functioning as a top plate is configured by the dielectric window main body 4 and the dielectric cover plate 6. An opening portion of the spacer 1b is sealed by the shower plate 7 via the seal ring 5 so that the gas in a space 1B may be prevented from leaking upwardly.

A gas dispersion groove 8 is formed in an upper surface of the dielectric window main body 4 and a plurality of opening portions 9 are formed in a lower surface thereof. Each of the opening portions 9 is connected to the gas dispersion groove 8. A plasma excitation gas such as Ar or Kr is supplied from a gas supply unit 10 arranged to the gas dispersion groove 8. Each of the opening portions 9 may be filled with a differential pressure forming material 11, in which a plurality of fine holes or a porous body is formed, to generate a difference in pressure between the plasma excitation gas supplied to the gas dispersion groove 8 and the space 1B located directly under the dielectric window main body 4.

The plasma excitation gas is supplied from the gas supply unit 10 to the opening portions 9 via the gas dispersion groove 8. Since a differential pressure is formed by the differential pressure forming material 11, the plasma excitation gas is spurted at a substantially uniform concentration from the opening portions 9 to the space 1B directly under the dielectric window main body 4 in the chamber 1. Also, a contact surface between the dielectric window main body 4 and the dielectric cover plate 6 is sealed by the seal ring 5 to prevent the leakage of the plasma excitation gas in the gas dispersion groove 8. An upper plate 1*a* covering the upper surface of the spacer 1*b* and the outer edge portion of the dielectric cover plate 6 is arranged to fix the shower plate 7 to the spacer 1*b*. A contact surface between the upper plate 1*a* and the dielectric cover plate 6 is sealed by the seal ring 5.

A slot antenna 12 having a radiation surface operating as an electromagnetic energy supply unit is provided via a second gap 19 outside the dielectric cover plate 6. The slot antenna 12 is connected to an external microwave source (not shown) via a coaxial waveguide 13. The slot antenna 12 excites the plasma excitation gas in the space 1B by radiating microwaves of 2.45 GHz, for example, supplied from the microwave source, thus radicalizing the process gas.

The slot antenna 12 is a radial line slot antenna and, as shown in FIG. 2, includes an antenna main body 12*a* having a flat disc shape connected to an inner waveguide 132 of the coaxial waveguide 13. A plurality of slots 12*b* and a plurality of slots 12*c* perpendicular to the slots 12*b* are formed in the antenna main body 12*a*. A wavelength-shortening plate 14 formed of a dielectric and having a constant thickness is inserted above the antenna main body 12*a*. The slot antenna 12 and the wavelength-shortening plate 14 are fixed to a plate cover 15 that functions as a cover member, thus covering an upper opening of the upper plate 1*a*. A gap of a predetermined height is formed between the upper plate 1*a* and the dielectric cover plate 6. The plate cover 15 covers the wavelength-shortening plate 14 and the slot antenna 12 to cool the slot antenna 12. A coolant is supplied to the inside of the plate cover 15.

A first gap 16 exists between the inner wall of the spacer 1*b* and the outer circumferential surfaces of the dielectric window main body 4 and the dielectric cover plate 6 facing the inner wall. The first gap 16 is connected to an atmosphere suction hole 17 as a first suction hole and a gas exhaust hole 18 as a first exhaust hole, which are formed in the spacer 1*b*. A second gap 19 of a fine area exists between the radiation surface of the slot antenna 12 and the upper surface of the dielectric cover plate 6 facing the radiation surface, and between the inner wall of the upper plate 1*a* and the outer circumferential surfaces of the slot antenna 12 and the wavelength-shortening plate 14, facing the inner wall. The second gap 19 is connected to an atmosphere suction hole 20 as a second suction hole formed in the upper portion of the plate cover 15.

Also, a gap 21 exists between the lower surface of the plate cover 15 and the upper surface of the wavelength-shortening plate 14 facing the lower surface. The gap 21 is connected to a gas exhaust hole 22 formed in an outer waveguide 131 of the coaxial waveguide 13 via a gap between the outer waveguide 131 and an inner waveguide 132. A hole through which the inner waveguide 132 of the coaxial waveguide 13 passes is formed in the plate cover 15. The hole functions as a second exhaust hole. Also, the second gap 19 is connected to the gap 21 via the slots 12*b* and 12*c* of the slot antenna 12 and a gap 14*a* of a fine area between the wavelength-shortening plate 14 and the inner waveguide 132 of the coaxial waveguide 13 from a fine gap at a contact surface between the slot antenna 12 and the wavelength-shortening plate 14.

The gas exhaust hole 18 formed in the spacer 1*b* is connected to a gas flow rate adjustment unit 24 via an exhaust pipe 23. The gas exhaust hole 22 formed in the outer waveguide 131 of the waveguide 13 is connected to a gas flow rate adjustment unit 26 via an exhaust pipe 25. The gas flow rate adjustment units 24 and 26 function as flow rate adjustment units. Also, the gas exhaust hole 22 may be directly formed in the plate cover 15 as the second exhaust hole without formed in the outer waveguide 131 of the waveguide 13.

The gas flow rate adjustment units 24 and 26 adjust the amounts of gas sucked through the gaps 16, 19, and 21 to generate a gas flow having the same flow rate from the gas exhaust holes 18 and 22. After the flow rate of the gas flow such as the atmospheric air or gas is adjusted by the gas flow rate adjustment units 24 and 26, the atmospheric air or gas is sucked by a gas suction unit 28 and a toxic gas component is removed by a gas purification unit 29 operating as a gas purification unit. The gas suction unit 28 operating as a suction unit sucks the atmospheric air or gas using a suction force due to a weak negative pressure generated in the first gap 16 and the second gaps 19 and 21. A gas flow generating unit is configured by the gas suction unit 28 and the gas flow rate adjustment units 24 and 26.

Also, without installing the gas flow rate adjustment units 24 and 26, the flow rate may be equalized by adjusting the size of an opening of the atmosphere suction holes 17 and 20.

In the plasma processing apparatus 50 configured as above, microwaves supplied via the coaxial waveguide 13 proceed in the wavelength-shortening plate 14 in a radial direction of the slot antenna 12. In doing so, the wavelength of the microwaves is reduced by the wavelength-shortening plate 14. Since the slots 12*b* and 12*c* are formed concentrically and perpendicularly to one another corresponding to the wavelength of the microwaves proceeding in the radial direction, plane waves of circular polarization may be radiated in a direction substantially perpendicular to the antenna main body 12*a*. The microwaves radiated in a process space from the slot antenna 12 excite the plasma excitation gas supplied from the opening portions 9 to the space 1B via the gas dispersion groove 8. Accordingly, since the electron temperature of high density plasma generated as above is low, damage to the substrate 2 to be processed will most likely not occur. Also, metal contamination generated due to the sputtering of the inner wall of the chamber 1 or the spacer 1*b* is not generated.

In the chamber 1 and the spacer 1*b*, the process gas is supplied from a process gas supply source (not shown) to the space 1B between the shower plate 7 and the substrate 2 to be processed via the process gas supply hole 30. As the process gas is supplied to the space 1B, the supplied process gas is radicalized by the high density plasma generated in the space 1B so that an etching process or film forming process may be performed on the substrate 2 to be processed in an efficient, constant, and high speed plasma process, without damaging the substrate 2 to be processed and devices on the substrate 2 to be processed.

Since the gas suction unit 28 sucks the gas in the first gap 16 and the second gaps 19 and 21 from the gas exhaust holes 18 and 22 via the exhaust pipes 23 and 25 and the gas flow rate adjustment units 24 and 26, the atmospheric air is sucked in from the atmosphere suction holes 17 and 20 so that the atmospheric air exists in the first gap 16 and the second gaps 19 and 21.

When the dielectric window main body 4 is broken, the plasma excitation gas or process gas in the space 1B flows into the first gap 16 between the inner wall of the spacer 1*b* and the outer circumferential surfaces of the dielectric window main body 4 and the dielectric cover plate 6. Also, when not only the dielectric window main body 4 but also the dielectric cover plate 6 is broken, the plasma excitation gas or process gas flows into the second gap 19 between the dielectric cover plate 6 and the slot antenna 12. Also, the plasma excitation gas or process gas flows into the gap 21 from the slots 12*b* and 12*c* of the slot antenna 12 and the fine gap between the slot antenna 12 and the wavelength-shortening plate 14, through the gap 14a between the wavelength-shortening plate 14 and the inner waveguide 132 of the coaxial waveguide 13.

However, the atmospheric air in the first gap 16 and the second gaps 19 and 21 is sucked by the gas suction unit 28 via the gas flow rate adjustment units 24 and 26 from the gas exhaust holes 18 and 22. Accordingly, even when the plasma excitation gas or process gas flows into each of the first gap 16 and the second gaps 19 and 21, the plasma excitation gas or process gas is sucked by the gas suction unit 28 and a toxic gas may be purified by the gas purification unit 29. Thus, even when the dielectric window main body 4 or the dielectric cover plate 6 is broken, since the toxic gas is not leaked outside the apparatus and can be collected in a predetermined place other than the process container, danger may be avoided and the surrounding environment may not be contaminated.

Also, while the plasma excitation gas is supplied by the gas supply unit 10, the gas flow is preferably generated by sucking the leaked gas and the atmospheric air in the second gaps 19 and 21 using the gas suction unit 28.

Figure 3:
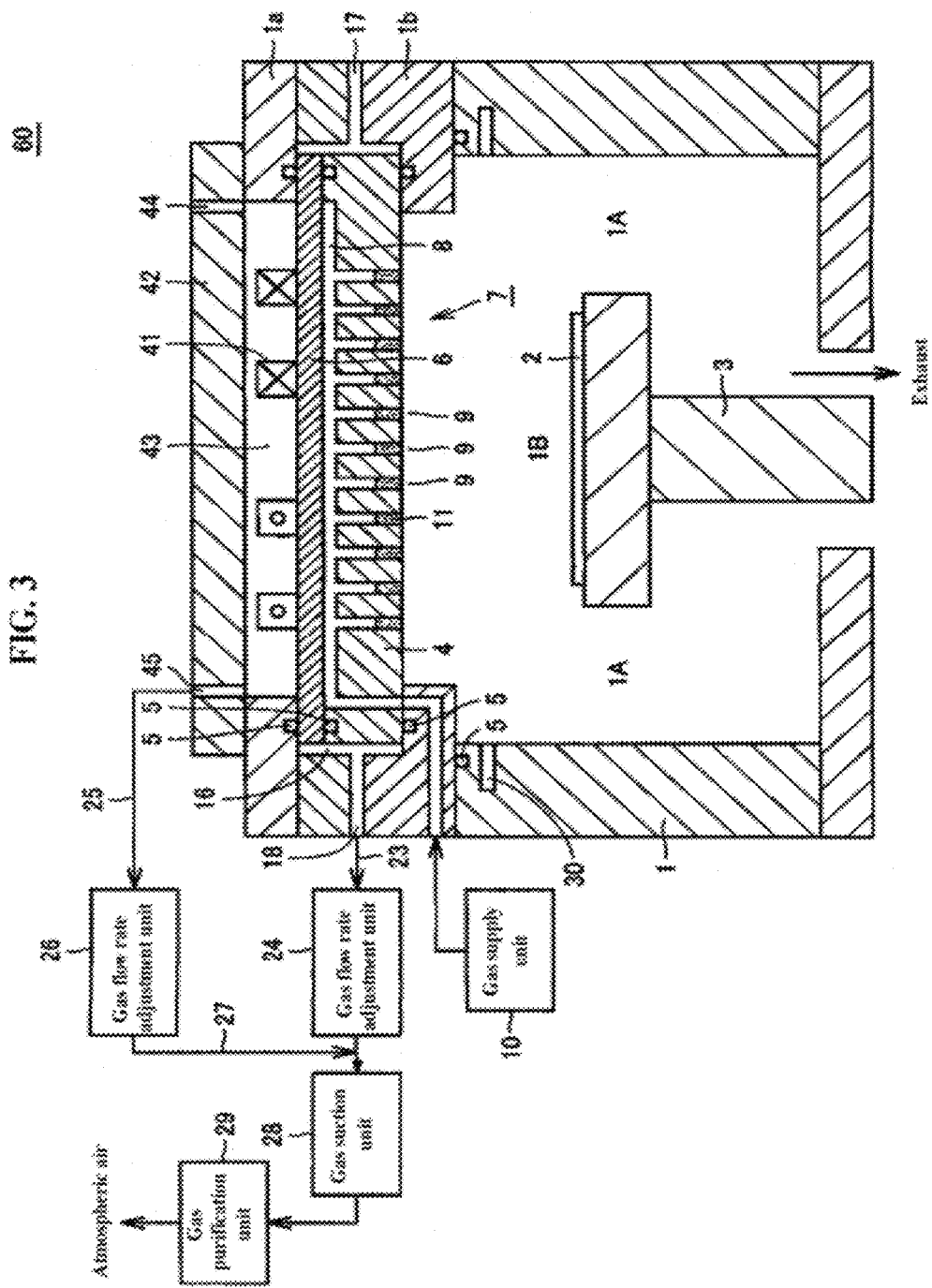
FIG. 3 is a cross-sectional view of a plasma processing apparatus according to another embodiment of the present invention.

FIG. 3 is a cross-sectional view of a plasma processing apparatus 60 according to another embodiment of the present invention. While the plasma processing apparatus 50 of FIG. 1 generates plasma using the slot antenna 12 through which microwaves pass, the plasma processing apparatus 60 of FIG. 3 generates inductively coupled plasma (ICP). The ICP generates plasma by applying a high voltage to a gas. For example, a high temperature plasma is generated by generating a variable magnetic field based on a high frequency signal of 13.56 MHz to generate Joule's heat by an eddy current in the plasma.

In FIG. 3, an electromagnetic energy radiation antenna 41 operating as an electromagnetic energy supply unit and a plate cover 42 are arranged, instead of the slot antenna 12, the coaxial waveguide 13, the wavelength-shortening plate 14, and the plate cover 15 shown in FIG. 1. The other structure is the same as that of FIG. 1.

A gap 43 is formed between the dielectric cover plate 6 and the plate cover 42. The electromagnetic energy radiation antenna 41 is arranged on the dielectric cover plate 6 in the gap 43. The electromagnetic energy radiation antenna 41 is obtained by winding a flat coil in a vortex shape. When a high frequency signal is applied as a high current to the flat coil, a high voltage and a variable magnetic field of a high frequency may be obtained at the same time so that the ICP may be generated in the space 1B under the shower plate 7.

An atmosphere suction hole 44 and a gas exhaust hole 45 are formed in the plate cover 42. The gas exhaust hole 45 is coupled to the gas flow rate adjustment unit 26 via the exhaust pipe 25. The atmosphere suction hole 17 forms a first suction hole while the atmosphere suction hole 44 forms a second suction hole. Also, in the present embodiment, the first gap 16 is formed between the inner wall of the spacer 1b and the outer circumferential surfaces of the dielectric window main body 4 and the dielectric cover plate 6 facing the inner wall. The first gap 16 is connected to the gas exhaust hole 18 and the atmosphere suction hole 17.

When the dielectric window main body 4 is broken, the plasma excitation gas supplied to the space 1B flows into the first gap 16 between the inner wall of the spacer 1b and the outer circumferential surfaces of the dielectric window main body 4 and the dielectric cover plate 6. Also, when not only the dielectric window main body 4 but also the dielectric cover plate 6 is broken, the plasma excitation gas flows into the gap 43 between the dielectric cover plate 6 and the plate cover 42.

However, since the gas in the first gap 16 is sucked by the gas suction unit 28 via the gas flow rate adjustment unit 24 from the gas exhaust hole 18, even when the plasma excitation gas flows into the first gap 16, the plasma excitation gas is sucked by the gas suction unit 28 and the toxic gas is purified by the gas purification unit 29, thus exhausting only the atmosphere. Also, the plasma excitation gas flowing into the gap 43 is sucked by the gas suction unit 28 via the gas flow rate adjustment unit 26 from the gas exhaust hole 45 so that the toxic gas is purified by the gas purification unit 29. Thus, even when the dielectric window main body 4 or the dielectric cover plate 6 is broken, since the toxic gas can be collected in a predetermined place other than the process container, the plasma excitation gas is not leaked out of the plasma processing apparatus 60 so that danger may be avoided.

Although in the embodiment shown in FIGS. 1 and 3 the dielectric window main body 4 and the dielectric cover plate 6 are described as being separated from each other, the dielectric window main body 4 and the dielectric cover plate 6 may be formed integrally.

Also, in a plasma process apparatus using a conventional top plate formed of a dielectric having a disc shape instead of the dielectric window main body 4 and the dielectric cover plate 6, in which a gas distribution unit distributing the plasma excitation gas is separately provided under the top plate, when the top plate is broken, the leakage of the plasma excitation gas out of the plasma processing apparatus may be prevented by employing the present invention.

Also, although in the embodiment shown in FIGS. 1 and 3 the first atmosphere suction hole 17 is described as being formed in the chamber 1, since the contact surface between the outer circumferential surfaces of the upper plate 1a and the spacer 1b is not sealed by the seal ring 5, the atmosphere may be sucked from the contact surface without particularly forming the atmosphere suction hole 17. Similarly, without forming the atmosphere suction hole 20 in the plate cover 15 of FIG. 1, the atmospheric air can be sucked from the contact surface between the plate cover 15 and the upper plate 1a. Furthermore, since the atmosphere can be sucked from the contact surface between the plate cover 42 and the upper plate 1a of FIG. 3, the atmosphere suction hole 44 may be omitted.

Also, an exhaust unit (not shown) for maintaining the process container at a negative pressure may also function as the gas suction unit 28.

While this invention has been particularly shown and described with reference to exemplary embodiments thereof, it will be understood by those skilled in the art that various changes in form and details may be made therein without departing from the spirit and scope of the invention as defined by the appended claims.

As described above, according to the present invention, since an gas flow moving out of the process container is generated at at least one side of the first gap between the inner wall of the process container and the surface of the top plate facing the inner wall of the process container and the second gap between the top plate and the cover member, even when the top plate is broken and the gas is leaked between the gap, the gas may be collected in a predetermined place other than the process container. Thus, the gas is prevented from leaking out of the apparatus.

The plasma processing apparatus and method according to the present invention can be used for etching processing or film forming processing a substrate to be processed using generated plasma.

What is claimed is:
1. A plasma processing apparatus comprising:
a process container having an upper opening;

a top plate which seals the upper opening of the process container, the top plate having an outer circumferential surface and a top surface, wherein the top plate comprises: a dielectric window main body; and a dielectric cover member covering the dielectric window main body;

a first gap formed between an inner wall of the process container and the outer circumferential surface, the first gap being closed from inside the process container;

a cover member which covers the dielectric cover member while forming a second gap between the cover member and the top surface;

an electromagnetic energy supply unit arranged in the second gap, the electromagnetic energy supply unit supplying electromagnetic energy to generate plasma in the process container;

a plasma gas distribution unit distributing a plasma gas in the process container through between the dielectric window main body and the dielectric cover member; and a gas flow generation unit which generates a gas flow moving out of the process container from the first and second gaps in such a manner that, when the top plate is failed and the plasma gas leaks, the leaking plasma gas can be trapped in the gas flow.

2. The plasma processing apparatus of claim 1, wherein the process container comprises a first exhaust hole connected to the first gap, the cover member comprises a second exhaust hole connected to the second gap, and the gas flow generation unit comprises a flow rate adjustment unit that controls a gas flow moving toward the first exhaust hole and a gas flow moving toward the second exhaust hole to have the same flow rate.

3. The plasma processing apparatus of claim 2, wherein the gas flow generation unit comprises:

a suction unit sucking a gas flow including the leaking plasma gas by making the first and second gaps under a weak negative pressure; and a gas purification unit purifying a toxic gas from the leaked gas.

4. The plasma processing apparatus of claim 3, wherein the plasma gas distribution unit comprises:

a plurality of openings formed in the dielectric window main body and distributing the plasma gas to the process container; and a supply groove formed in the dielectric window main body and supplying the plasma gas to the plurality of openings.

5. The plasma processing apparatus of claim 3, wherein the electromagnetic energy supply unit is arranged above the top plate, supplies electromagnetic energy passing through the top plate to the process container, and includes a flat antenna generating plasma under the top plate, and wherein the second exhaust hole is connected to the second gap facing the flat antenna and the top plate and the gas in the second exhaust hole is sucked by the suction unit.

6. The plasma processing apparatus of claim 5, wherein a plurality of slots are formed in the flat antenna, and the apparatus comprises a coaxial waveguide having an inner conductive body connected to the flat antenna and an outer conductive body in which an opening connected to the second exhaust hole is formed.

7. The plasma processing apparatus of claim 3, wherein the electromagnetic energy supply unit comprises a flat coil wound in a vortex shape arranged above the top plate and generating under the top plate high temperature plasma obtained by generating Joule's heat by an eddy current in the plasma, by a variable magnetic field generated by a high frequency signal, and wherein the second exhaust hole is connected to the second gap and the gas in the second exhaust hole is sucked by the suction unit.

8. The plasma processing apparatus of claim 2, wherein the first exhaust hole connected to the first gap is formed in a side wall of the process container.

9. The plasma processing apparatus of claim 1, wherein the process container comprises a first suction hole sucking atmospheric air and connected to the first gap.

10. The plasma processing apparatus of claim 1, wherein the cover member comprises a second suction hole sucking atmospheric air and connected to the second gap.

* * * * *